United States Patent [19]
Isaacs et al.

[11] 3,958,863
[45] May 25, 1976

[54] TL₃TAS₄ AND TL₃TASE₄ CRYSTALS AND ACOUSTO-OPTICAL DEVICES

[75] Inventors: Thelma J. Isaacs, Murrysville; Milton Gottlieb, Pittsburgh, both of Pa.

[73] Assignee: Westinghouse Electric Corporation, Pittsburgh, Pa.

[22] Filed: Jan. 10, 1975

[21] Appl. No.: 540,192

[52] U.S. Cl. .......................... 350/161; 331/94.5 M
[51] Int. Cl.² ...................... H01S 3/10; G02F 1/29
[58] Field of Search ............ 350/161; 423/115, 117, 423/511; 331/94.5

[56] References Cited
UNITED STATES PATENTS 3,746,866   7/1973   Feichtner et al. .................... 350/161
3,799,659   3/1974   Roland et al. ...................... 350/161

OTHER PUBLICATIONS

Crevecoeur, Some Ternary Thallium Chalcogenides, Acta Crystallographica, Vol. 17 (Jan.–June 1964) p. 757.

Primary Examiner—William L. Sikes
Attorney, Agent, or Firm—R. D. Fuerle

[57] ABSTRACT

Single crystals of $Tl_3TaS_4$ and $Tl_3TaSe_4$ are disclosed which have useful acousto-optical properties, including low acoustic velocities and high acousto-optical figures of merit. They are used in acousto-optical devices such as a display device, a laser modulator, a non-collinear tunable filter, an acousto-optical delay line, and an acousto-optical waveguide modulator.

26 Claims, 6 Drawing Figures

$Tl_3TaS_4$ AND $Tl_3TaSe_4$ CRYSTALS AND ACOUSTO-OPTICAL DEVICES

CROSS-REFERENCE TO RELATED APPLICATIONS

The following applications are assigned to the same assignee as this application. This application is related to application Ser. No. 392,695, filed Aug. 29, 1973 entitled "$Tl_3VS_4$ and $Tl_3NbS_4$ Crystals and Acousto-Optical Devices."

This application is related to application Ser. No. 540,194 filed of even date by Robert W. Weinert and Thelma J. Isaacs titled "Crystals Having Zero Temperature Coefficients of Delay."

This application is also related to application Ser. No. 540,193 filed of even date by T. V. Isaacs and R. W. Weinert titled "Acoustic Surface Wave Devices Using $Tl_3TaS_4$ and $Tl_3TaSe_4$ Crystals."

This application is also related to application Ser. No. 463,337 filed Apr. 23, 1974 by T. J. Isaacs and M. R. Daniel titled "Acoustic Surface Wave Device." That application describes surface wave devices which use crystals of $Tl_3VS_4$, $Tl_3NbS_4$, or mixtures thereof.

BACKGROUND OF THE INVENTION

In 1932 Brillouin discovered that high frequency sound waves can cause diffraction of light. Due to the development of the laser and advances in high frequency acoustic techniques, many applications for this phenomenon have been found such as display devices, laser modulators, tunable filters, acoustic delay lines and acousto-optical waveguide modulators.

A sound wave in a medium produces alternating compression and rarefaction fronts. The index of refraction in these fronts is different, so that the medium acts as a diffraction grating, diffracting light which passes through it, the angle of diffraction increasing as the frequency of the sound waves increases, and the amount of light diffracted increasing with the intensity of the sound wave.

There are two modes of diffraction, the Debye-Sears mode and the Bragg mode. The Debye-Sears mode is obtained if the width of the acoustic beam is less than about $\Lambda^2/(4\lambda)$ and the Bragg mode is obtained if the width of the acoustic beam is greater than about $\Lambda^2/4\lambda$ where $\Lambda$ is the acoustic wavelength and $\lambda$ is the light wavelength. In both modes the acoustic wavelength must be greater than the light wavelength $\lambda$, and $\lambda$ must, of course, be within the transparency region of the crystal. In the Debye-Sears mode light enters the crystal parallel to the acoustic wave fronts (0° diffracting angle) and is multiply-diffracted into many images or orders of the initial light beam. In the Bragg mode light enters the crystal at the Bragg Angle $\phi$ to the acoustic wave fronts where $\sin \phi = \lambda/2\zeta$. In this mode the acoustic wavelength and the Bragg angle are matched to the particular light wavelength, and a single order is diffracted from the crystal at the Bragg angle $\phi$ to the acoustic wave fronts.

A good acousto-optical material should have a high figure of merit $M_2$, a measure of the amount of light diffracted for a given amount of acoustic power, where $M_2 = n^6 p^2/\rho v^3$ and $n$ is the refractive index, $p$ is the photoelastic coefficient, $\rho$ is the density, and $v$ is the acoustic velocity. As the formula indicates, a high refractive index and a low velocity will give a high figure of merit. Also, a low velocity will give a greater delay per unit length if the crystal is used in a delay line thus permitting acoustic signal processing devices to have smaller physical dimensions. A good acousto-optical material should also have a low acoustic attenuation, allowing a high frequency wave to propagate a long distance before it is absorbed.

The following table gives a few of the properties of some of the best acousto-optical materials currently known for use in the near infrared region of the spectrum:

| Material | Optical Range ($\mu$ m) | Longitudinal Acoustic Velocity ($\times 10^5$ cm/sec) | Acousto-Optical Figure of Merit $M_2$ |
|---|---|---|---|
| Ge | 2–20 | 5.5 | 525 |
| $As_2S_3$ glass | 0.9–11 | 2.6 | 230 |
| GaAs | 1–11 | 5.15 | 93 |
| $Tl_3AsS_4$ | 0.6–12 | 2.15 | 330 |
| $PbMoO_4$ | 0.4–5.5 | 3.83 | 24 |

ADDITIONAL BACKGROUND

The instant inventors had made several attempts to make the compound $Tl_3NbS_4$ but had been unsuccessful each time because complete reaction to form a homogeneous product was not attained and at least two different phases were formed. Very little work had been done on making the compound $Tl_3TaS_4$ due to the difficulty in making $Tl_3NbS_4$, and because of expert advice that $Tl_3TaS_4$ would be even more difficult to make as a satisfactory reactant material than $Tl_3NbS_4$.

However, during one last attempt at making $Tl_3NbS_4$ the controller on the furnace malfunctioned and the melt was heated to almost 1200°C. Such high temperatures would never normally be tried because of the danger of explosion from the sulfur vapors present and because the silica-glass ampoule used to hold the melt begins to soften at those temperatures. But the fortuitous result of the controller malfunction was that the compound $Tl_3NbS_4$ was successfully made in essentially a single phase.

Having seen the light, an effort was made to produce the compounds $Tl_3TaS_4$ and $Tl_3TaSe_4$ using temperatures over 1100°C and again the compounds were successfully made. Later it was found that lower and safer temperatures of about 850°C could be used if the temperature was maintained for a longer time (about 3 to 4 days). Making the compound in a single phase, of course, did not mean that a large, single crystal could be grown from the compound, but later efforts to grow the crystals were successful.

PRIOR ART

An article entitled "Some Ternary Thallium Chalcogenides" by C. Crevecoeur appears in the January-June 1964 volume (Vol. No. 17) of Acta Crystallographica on page 757. That article describes the preparation and characteristics of the isomorphous compounds $Tl_3VS_4$, $Tl_3NbS_4$, $Tl_3TaS_4$, $Tl_3VSe_4$, $Tl_3NbSe_4$, and $Tl_3TaSe_4$. Large, single crystals were not prepared and non-linear and acousto-optical properties are not mentioned.

An article entitled "Magnetic Susceptibility of Ternary Compounds $Tl_3VS_4$ and $Tl_3TaS_4$," by M. Matyas and K. Cermak appears on pages 1305 and 1306 of the Czechoslovakian Journal of Physics (1969).

An article entitled "Luminescence Spectra of Ternary Compounds of $Tl_3BX_4$ Type" by N. A. Garyunova, V. M. Orlov, V. I. Sokolova, E. V. Tsvetkova, and Yu. G. Shreter appears on pages K127 and K128 of Physica Status Solidi (1972).

SUMMARY OF THE INVENTION

We have found that large single crystals can be grown of $Tl_3TaS_4$ and $Tl_3TaSe_4$. We have also found that these crystals possess excellent acousto-optical properties and can be used in various acousto-optical devices.

DESCRIPTION OF THE INVENTION

PREPARATION OF COMPOUND AND CRYSTAL

Figure 1:
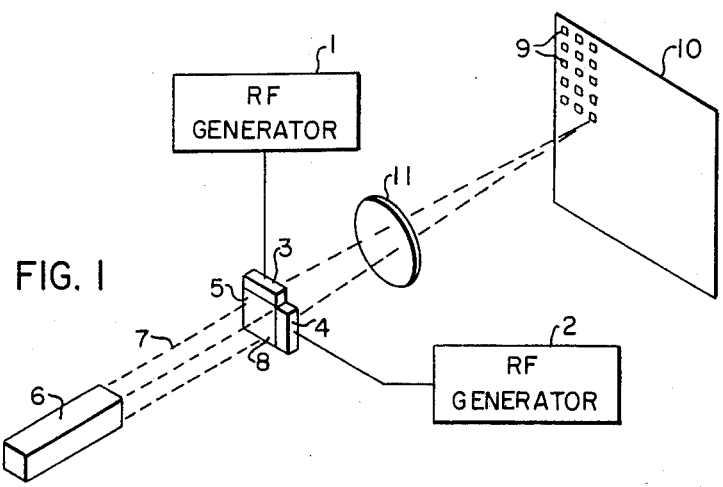
FIG. 1 is an isometric diagrammatic drawing of a display device.

The compounds of this invention may be prepared from very pure quantities of the elements involved. First the thallium is washed in distilled water and the tantalum in dilute acid to remove oxides which may interfere with crystal growth. Then the elements are mixed and melted together in an evacuated container with intermittent agitation until they react to form the compound. Several days of heating the melt may be required. The temperature of the melt must be maintained considerably above the melting point (e.g., 800° to 1000°C) in order for a complete reaction to occur within a reasonable period of time (e.g., a few days).

A crystal may be prepared from the compound by the Stockbarger technique in which the compound is sealed in a quartz tube under argon, melted, and lowered very slowly (10 to 15 mm/day) through a two-zone furnace having a steep temperature gradient (8° to 14°C/mm) at the melting point of the compound. The crystals may be made slightly non-stoichiometric (± 5%) in order to obtain the optimum crystal composition which may in fact be slightly non-stoichiometric. Non-conducting mixtures of the two crystals are also contemplated (e.g., $Tl_3TaS_2Se_2$) where "non-conducting" means having a resistivity greater than $10^5 \Omega$ cm.

THE CRYSTALS

The crystals of this invention are isotropic, piezoelectric, and cubic. They have the CsCl structure, I $\bar{4}$ 3m, with two formula units per unit cell, and their diffraction aspect derived from X-ray data is I***.

It is generally desirable to have the crystals large in order to maximize the diffracted light, but if the crystal is too thick (i.e., more than about 10 cm.) light loss due to absorption will be high. On the other hand, the crystal must not be too thin in the direction of light propagation as this will result in poor interaction between the light and sound, but a crystal as small as 3 mm. long can be optically useful. Also, from the point of view of crystal fabrication, sizes of at least 3 mm. are required, since it is very difficult to orient, cut, and polish crystals much smaller than this, and to bond transducers to them. The length of the crystal in the direction of propagation of the acoustic wave must be at least as large as the input beam can be focused, about $10^{-3}$ cm., so that light is not wasted. For acousto-optical applications the crystal must be large enough to produce a Bragg interaction between sound and light. That requires at least 10 acoustic wave fronts which means a minimum length of $3 \times 10^{-2}$ mm. is required at an acoustic frequency of 300 MHz.

Preferably the crystal should be at least about ½ cm. in diameter and about 1 cm. long to have practical usefulness in most acousto-optical devices. The crystal also preferably has at least two polished parallel optical faces, which preferably are perpendicular to the direction of propagation of pure shear or pure longitudinal modes in the crystal. That direction is preferably along an axis.

THE SOUND WAVES

The sound wave may be a longitudinal wave, where the particle motion is in the direction of propagation of the wave, or it may be a shear wave, where the particle motion is perpendicular to the propagation direction of the wave, or it may be a combination of both. Preferably, it is either pure shear or pure longitudinal because the two waves travel at different velocities and quickly become out of phase. For delay line applications shear waves are desirable because of their lower velocity. Shear waves can also be used in applications where the plane of polarization of the light is rotated when the light is diffracted. Pure shear waves are obtained by propagating the wave in a pure shear direction (determined by the symmetry of the crystal) using a shear wave generating transducer such as Y cut or A–C cut quartz, which is bonded to the crystal. Longitudinal waves are obtained by propagating the wave along the c-axis or another pure longitudinal mode direction using a longitudinal wave generating transducer such as X-cut quartz which is bonded to the crystal.

The sound wave may also be a surface wave. Surface waves can be generated by transducers mounted on the surface of the crystal.

DISPLAY DEVICES

In a display device a light beam is directed at the crystal and the deflected beam which leaves the crystal is directed at some type of viewing screen.

In FIG. 1 RF generators 1 and 2 send RF signals to transducers 3 and 4 respectively which respectively generate vertically moving and horizontally moving sound waves in crystal 5, preferably in the Bragg mode so that there is only one diffracted beam. The light, which is preferably collimated and polarized, is obtained from laser 6 which generates a coherent beam of light 7 directed at one of the two parallel optical faces 8 of crystal 5. Light passing through crystal 5 is directed at various spots 9 on viewing screen 10 by means of the vertically and horizontally moving sound waves generated by transducers 3 and 4. Lens 11 focuses the light at the spot.

The illuminated spots may each be a page of information which is then optically enlarged and projected on a second viewing screen (not shown). The illuminated spots could also in themselves form a pattern. For example, viewing screen 10 could be an infrared-sensitive phosphor coated screen such as zinc sulfide doped with lead and copper and flooded with UV light and the successive illumination of selected spots would form a picture similar to a TV picture. Or, viewing screen 10 could be an infrared or thermally-quenched UV-excited phosphor screen where ultraviolet light causes the entire screen to be illuminated, but each selected spot successively struck by the beam from crystal 5 is darkened to form a picture on the screen.

LASER MODULATOR

In a laser modulator the acousto-optical system modulates a portion of the output of the lasing medium. If the light is focused to less than about $10^{-2}$ or $10^{-3}$ cm. it will be modulated but not diffracted. For greater diameter focal spots it will be both diffracted and modulated. A laser modulator could be used, for example, to send signals by means of the fluctuating laser beam intensity.

Figure 2:
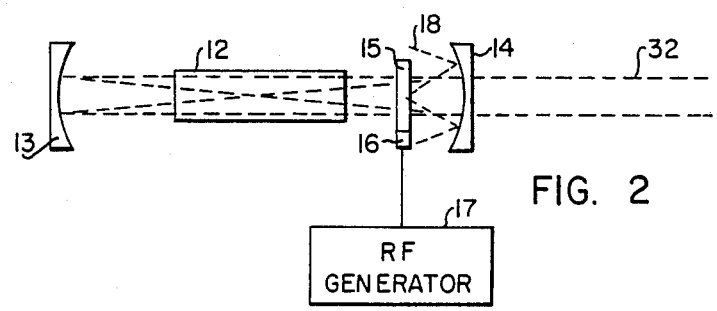
FIG. 2 is a diagrammatic drawing of a laser modulator of the internal configuration.

FIG. 2 shows a laser modulator of the internal configuration. In FIG. 2, lasing medium 12 produces a beam of coherent light which is multiply-reflected between mirrors 13 and 14. Mirror 13 totally reflects the light and mirror 14 partially reflects it and partially transmits it as the laser output 32. Interposed between lasing medium 39 and mirror 14 is crystal 15. (The crystal could also be positioned between mirror 13 and the lasing medium). To crystal 15 is affixed a transducer 18 which is electrically connected to an RF generator 12. This generator produces a radio-frequency electrical signal which transducer 16 converts into an acoustic wave which moves through crystal 43 diffracting light as shown at 18.

Figure 3:
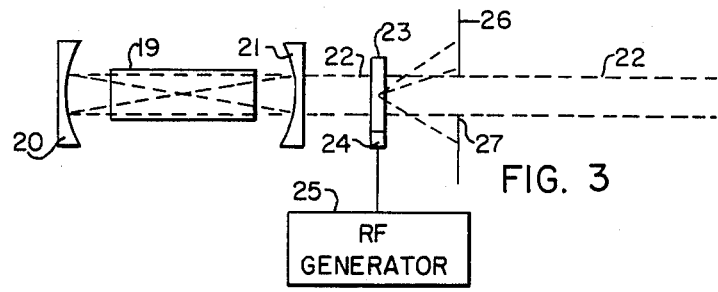
FIG. 3 is a diagrammatic drawing of a laser modulator of the external configuration.

FIG. 3 shows a laser modulator of the external configuration. In FIG. 3 lasing medium 19 produces a beam of coherent light which is multiply-reflected between mirror 20, which totally reflects the beam, and mirror 21 which partially reflects the beam and partially transmits it as laser output 22. The laser output 22 strikes crystal 23 to which is affixed transducer 24 electrically connected to RF generator 25. Generating a sound wave in the crystal diffracts the laser output causing it to strike screen 25 instead of passing through aperture 27 in the screen.

ACOUSTIC DELAY LINE

An acoustic delay line causes an electrical signal to be delayed for the length of time required for an acoustic signal to traverse the crystal, L/V, where L is the length of the crystal and V is the acoustic velocity, Unlike many other methods of delaying an electrical signal, an acoustic delay line preserves the original configuration of the signal.

Figure 4:
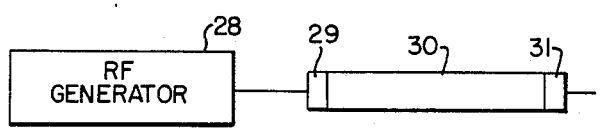
FIG. 4 is a diagrammatic drawing of an acoustic delay line.

In FIG. 4, RF generator 28 provides the electrical signal to be delayed. This signal is electrically transmitted to transducer 29 which converts the signal to an acoustic wave which is propagated through crystal 30. At the other end of the crystal transducer 31 detects the acoustic wave and converts it into an electrical signal.

NON-COLLINEAR FILTER

Figure 5:
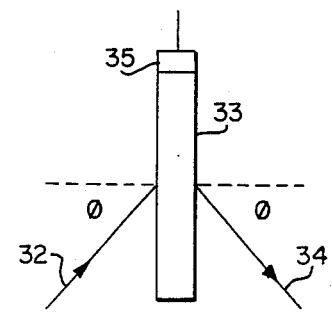
FIG. 5 is a diagrammatic drawing of a non-collinear acousto-optical filter.

In FIG. 5, a non-collinear filter, the incident light 32 strikes the crystal 33 at a fixed angle, $\phi$. Only light of wavelength $\lambda$, which satisfies the condition $$\lambda = \frac{V}{f} \sin \phi$$

will be diffracted at the angle 4 into the output beam 34; $f$ is the frequency applied to the transducer 35. Light of any other wavelength passes through the crystal undeflected. Any wavelength of light may be selected for deflection by choosing the appropriate frequency.

ACOUSTO-OPTIC WAVEGUIDE MODULATOR

Figure 6:
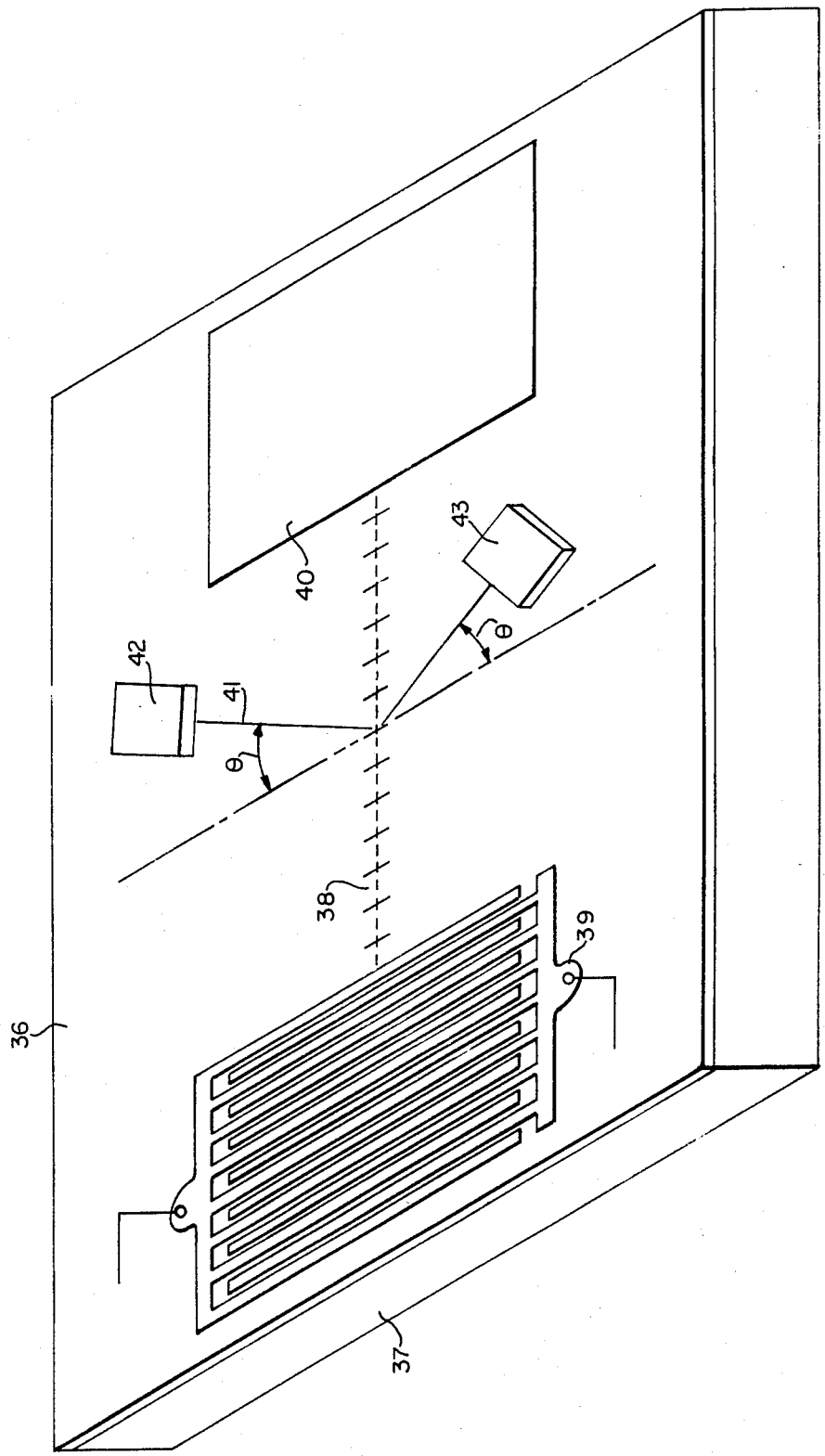
FIG. 6 is an isometric drawing of an acousto-optical waveguide modulator.

FIG. 6 illustrates an acousto-optical waveguide modulator, a type of hybrid piezoelectric acousto-optical device.

In FIG. 6 a thin film 36 of a single crystal according to this invention is mounted on a supporting substrate 37. The film acts as an optical waveguide and therefore must be on the order of about ½ to about 5 wavelengths thick. For the transparency ranges of the crystals of this invention, that is a thickness range of about 0.4 to about 100 μm.

The substrate 37 can be almost any material of any thickness which will support the film but it must have an index of refraction which is lower than the index of refraction of the film. An example would be a film of $Tl_3TaSe_4$ on a substrate of $Tl_3TaS_4$.

Another way of obtaining a suitable film-substrate combination is to alter (i.e., dope) the surface of a crystal of $Tl_3TaSe_4$ or $Tl_3TaS_4$ in such a way as to give the surface a higher index of refraction. This may be accomplished, for example, by bombarding the surface with ions such as helium ions or by diffusing related foreign atoms into the surface of the crystal. Related foreign atoms which can be substituted by diffusion include vanadium for tantalum and selenium for sulfur. Other possible dopants include niobium and tellurium, but they are not expected to work as well. Generally, a surface containing about 10 to about 100 ppm of a dopant which increases the index of refraction will be suitable.

Referring again to FIG. 6, a surface acoustic wave 38 is generated in film 36 by acoustic wave generator 39, shown as an interdigitated transducer. Sound wave 38 moves across the crystal and is absorbed by acoustic absorber 40.

A light beam 41, typically monochromatic and coherent, is introduced into the waveguide film 36 by input light coupler 42. The light beam is diffracted by the acoustic wave and leaves film 36 by output light coupler 43. The light couplers may be, for example, prism or grating couplers. The angle $\theta$ between the light beam and the normal to the acoustic wave is selected to satisfy the requirements for a Bragg acousto-optical interaction, and the sin of $\theta$ is equal to the light wavelength divided by twice the acoustic wavelength. The light beam is simultaneously deflected and frequency and amplitude modulated by the sound waves. The device can therefore be used to impose a signal on a light beam.

EXAMPLE

A quantity of very pure thallium was washed in distilled water and a quantity of very pure tantalum was washed in dilute HCl. The following quantities of elements were carefully weighed out:

| Composition | Tl | Ta | Elements S | Se |
|---|---|---|---|---|
| $Tl_3TaS_4$ | 6.9281 | 2.0381 | 1.4565 | |
| $Tl_3TaSe_4$ | 6.1311 | 1.8095 | | 3.1742 |

The elements for each composition were put into silica-glass ampoules which were then sealed under vacuum. The ampoules were heated to between 950° and 1000°C and were held at this temperature for several days, with intermittent shaking throughout. After cooling, the compounds were placed in crystal growing tubes and sealed under 0.8 atmospheres of pure, dry argon. The crystals were grown by melting the compounds and lowering them through steep (10 to 12mm/°C) temperature gradients at their melting points at the rate of 11.9 mm/day for $Tl_3TaS_4$ and 16.7 mm/day for $Tl_3TaSe_4$.

The crystals were about 0.5 × 0.5 × 2.5 cm. They were orientated, cut, and ground to have two parallel faces perpendicular to the axes.

In addition to these crystals, single crystals larger than ½ × ½ × 1 cm having the compositions $Tl_3TaSe_{4.02}$ and $Tl_3TaS_2Se_2$ were prepared by the same techniques.

Using crystals prepared as described above, the following properties of the crystals were determined.

| | $Tl_3TaS_4$ | $Tl_3TaSe_4$ |
|---|---|---|
| 1. transparency region ($\mu$m) | 0.6 to 12 | ~0.7* to ~15.2* |
| 2. melting point (°C) | 545±5°C | 600 ± 5°C |
| 3. refractive index at 0.6328$\mu$m | 2.4* | 2.58* |
| 4. acoustic velocity (cm/sec) | — | — |
|   a. longitudinal along c-axis | $2.69 \times 10^5$ | $2.4 \times 10^5$ |
|     in 110 direction | $2.22 \times 10^5$ | $2.1 \times 10^5$ |
|   b. slow shear waves along c-axis | $6.89 \times 10^4$ | $7.55 \times 10^4$ |
|     in 110 direction | $8.7 \times 10^4$ | $8.53 \times 10^4$ |
|   c. fast shear waves in 110 direction | $1.62 \times 10^5$ | $1.39 \times 10^5$ |
|   d. surface waves | $8.7 \times 10^4$ | — |
| 5. ultrasonic attenuation (dB/$\mu$ sec at 30/MHz) for longitudinal waves in 110 direction | 0.14 | 0.2 |
| 6. coupling coefficient | 3.5 | — |
| 7. acousto-optical figure of merit | 207 | 325 |

*estimated

Some of the above figures should be considered to be approximate and may be refined by further experimentation.

The acoustic properties were determined by the conventional pulse-echo technique, in which a pair of crystal quartz transducers are cemented onto opposing, flat, parallel faces of the crystal samples.

The acousto-optical figure of merit was measured by acoustically bonding the crystals onto a fused quartz buffer rod, so that a longitudinal wave acoustic pulse could be transmitted from the quartz to the crystals. By measuring the light diffracted by the pulse in the quartz and in the crystals, the figure of merit of the crystals relative to that of quartz was determined. The measurements were made at an optical wavelength of 0.6328$\mu$m for acoustic wave propagation in the 110 direction.

The crystals of this invention also display nonlinear properties which may be of use in certain devices not requiring phase-matching.

We claim as our invention:

1. A single crystal selected from the group consisting of $Tl_3TaS_4$, $Tl_3TaSe_4$, and mixtures thereof, within ± 5% of stoichiometric, which is at least 3 mm long.

2. A single crystal according to claim 1 wherein said single crystal is $Tl_3TaS_4$.

3. A single crystal according to claim 1 wherein said single crystal is $Tl_3TaSe_4$.

4. A crystal according to claim 1 having two parallel optical faces.

5. A single crystal according to claim 1 at least about ½ cm in diameter and at least about 1 cm long.

6. A single crystal according to claim 1 at least about 0.4 to about 100 $\mu$m thick fixed to the surface of a substrate of lower refractive index.

7. A crystal according to claim 6 which is doped with about 10 to about 100 ppm of a dopant selected from the group consisting of vanadium, selenium, and mixtures thereof and said substrate is said crystal undoped.

8. A method of diffracting light in a crystal according to claim 1 comprising generating a sound wave in said crystal the wave fronts of which are at a diffracting angle to said light.

9. An acousto-optical system comprising:
   1. a crystal according to claim 1;
   2. means for generating a sound wave in said crystal;
   3. means for propagating light in said crystal having a wavelength within the transparency range of said crystal at a diffracting angle to said sound wave; and
   4. means for detecting at least part of said light after it is diffracted.

10. An acoustic delay line comprising:
    1. a crystal according to claim 1;
    2. means for generating sound waves in said crystal; and
    3. means for detecting said sound waves after they have traversed said crystal.

11. A method of diffracting light in a crystal according to claim 6 comprising generating a surface acoustic wave in said crystal at a diffracting angle to said light.

12. A method according to claim 11 wherein said crystal is doped with about 10 to about 100 ppm of a dopant selected from the group consisting of vanadium, selenium, and mixtures thereof and said substrate is said crystal undoped.

13. An acousto-optical system according to claim 9 including means for generating a second sound wave perpendicular to the first sound wave, and including a viewing screen which is irradiated by said diffracted light.

14. An acousto-optical system according to claim 13 wherein said sound waves are in the Bragg mode.

15. An acousto-optical system according to claim 13 wherein said light is polarized and coherent.

16. An acousto-optical system according to claim 9 wherein the source of said light is a laser which comprises a lasing medium positioned between two opposing mirrors, one partially reflecting and the other totally reflecting.

17. An acousto-optical system according to claim 16 wherein said single crystal is positioned external to said laser.

18. An acousto-optical system according to claim 16 wherein said single crystal is positioned between said lasing medium and one of said mirrors.

19. An acousto-optical system according to claim 9 wherein said single crystal is a rectangle, said sound waves move the length of said rectangle, and said light wave is incident to the face of said rectangle at a non-normal angle.

20. An acousto-optical system according to claim 9 wherein said single crystal is $Tl_3TaS_4$.

21. An acousto-optical system according to claim 9 wherein said single crystal is $Tl_3TaSe_4$.

22. An acousto-optical system according to claim 9 having two parallel optical faces.

23. An acousto-optical system according to claim 9 wherein said single crystal is at least about ½ cm in diameter and at least about 1 cm long.

24. An acousto-optical system according to claim 9 wherein said single crystal is at least about 0.4 to about 100 m thick fixed to the surface of a substrate of lower refractive index.

25. An acousto-optical system according to claim 24 wherein said single crystal is doped with about 10 to about 100 ppm of a dopant selected from the group consisting of vanadium, selenium, and mixtures thereof and said substrate is said crystal undoped.

26. An acousto-optical system according to claim 25 wherein said sound wave is a surface wave.

* * * * *